(12) United States Patent
Kim

(10) Patent No.: US 7,071,059 B1
(45) Date of Patent: Jul. 4, 2006

(54) METHOD FOR FORMING RECESS GATE OF SEMICONDUCTOR DEVICE

(75) Inventor: Hyung Ki Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/148,557

(22) Filed: Jun. 9, 2005

(30) Foreign Application Priority Data

Dec. 30, 2004 (KR) .................. 10-2004-0116436

(51) Int. Cl.
*H01L 21/336* (2006.01)

(52) U.S. Cl. ............... 438/259; 438/270; 438/589
(58) Field of Classification Search ............ 438/259, 438/270, 272, 589
See application file for complete search history.

(56) References Cited

U.S. PATENT DOCUMENTS

| | | | |
|---|---|---|---|
| 6,777,737 B1* | 8/2004 | Mandelman et al. | 257/305 |
| 2005/0079661 A1* | 4/2005 | Cho et al. | 438/197 |
| 2005/0196947 A1* | 9/2005 | Seo et al. | 438/589 |
| 2005/0199930 A1* | 9/2005 | Seo et al. | 257/296 |

* cited by examiner

*Primary Examiner*—Michael Trinh
(74) *Attorney, Agent, or Firm*—Heller Ehrman LLP

(57) ABSTRACT

A method for forming a recess gate of a semiconductor device is disclosed. The method for forming a recess gate of a semiconductor device comprises forming a polysilicon layer pattern covering a contact region on a semiconductor substrate, etching a predetermined thickness of the semiconductor substrate in the active region using the polysilicon layer pattern as an etching mask to form a recess gate region, and forming and patterning the gate polysilicon layer, the gate conductive layer and the gate hard mask layer to form a recess gate.

3 Claims, 6 Drawing Sheets

METHOD FOR FORMING RECESS GATE OF SEMICONDUCTOR DEVICE

BACKGROUND OF THE INVENTION

1. Field of the Invention

The present invention generally relates to a method for forming a recess gate of a semiconductor device, and more specifically, to a method for forming a recess gate of a semiconductor device wherein a contact region is formed by depositing a polysilicon layer pattern covering the contact region prior to the formations of a recess gate region and a gate structure to suppress increase in resistance of the contact region and tWR (Write Recovery time) characteristics.

2. Description of the Related Art

FIG. 1 is a cross-sectional view illustrating a conventional method for forming a recess gate of a semiconductor device.

Referring to FIG. 1, a predetermined region of a semiconductor substrate 10 where a channel region is to be formed is etched to form a recess gate region (not shown). Thereafter, a gate oxide film (not shown) is formed in the recess gate region.

Next, a planarized polysilicon layer (not shown) filling up the recess gate region is formed on the entire surface. A stacked structure of a gate conductive layer and a gate hard mask layer is then formed on the planarized polysilicon layer.

Afterward, the stacked structure and the polysilicon layer are patterned to form a gate structure including a polysilicon layer pattern 30, a gate conductive layer pattern 40 and a gate hard mask layer pattern 50. Thereafter, a spacer 60 is formed on a sidewall of the gate structure.

In accordance with the above-described conventional method for forming a recess gate of a semiconductor device, when misalignment between a device isolation film and the gate structure occurs resistance of a storage node contact region of one cell of the two sharing one active region occurs due to overlay.

Moreover, the misalignment between the device isolation film and the gate structure causes the storage contact region to be not completely exposed in a subsequent etching process for forming a landing plug contact hole. As a result, the tWR characteristic of the device is deteriorated.

SUMMARY OF THE INVENTION

Accordingly, it is an object of the present invention to provide a method for forming a recess gate of a semiconductor device wherein a contact region is formed by depositing a polysilicon layer pattern covering the contact region prior to the formations of a recess gate region and a gate structure to suppress increase in resistance of the contact region and tWR characteristics.

In order to achieve above object of the present invention in accordance with a preferred embodiment, there is provided a method for forming a recess gate of a semiconductor device, comprising the steps of:

(a) forming a polysilicon layer pattern on a semiconductor substrate having an active region, the polysilicon layer pattern covering a contact region;

(b) forming an insulating film covering the polysilicon layer pattern;

(c) etching the semiconductor substrate using the polysilicon layer pattern as an etching mask to form a recess gate region in the active region;

(d) forming a planarized gate polysilicon layer at least filling up the recess gate region;

(e) depositing a gate conductive layer and a gate hard mask layer on the gate polysilicon layer to form a stacked structure of the gate polysilicon layer, the gate conductive layer and the gate hard mask layer;

(f) etching the stacked structure to form a gate structure, whereby the insulating film is exposed;

(g) forming a spacer on a top surface and a sidewall of the gate structure;

(h) removing the exposed insulating film to expose the polysilicon layer pattern; and (i) depositing a polysilicon film on the exposed polysilicon layer pattern in the contact region to form a landing plug.

DETAILED DESCRIPTION OF THE PREFERRED EMBODIMENTS

Reference will now be made in detail to exemplary embodiments of the present invention. Wherever possible, the same reference numbers will be used throughout the drawings to refer to the same or like parts.

FIGS. 2a through 2d illustrate a method for forming a recess gate of a semiconductor device according to a preferred embodiment of the present invention.

Figure 1:
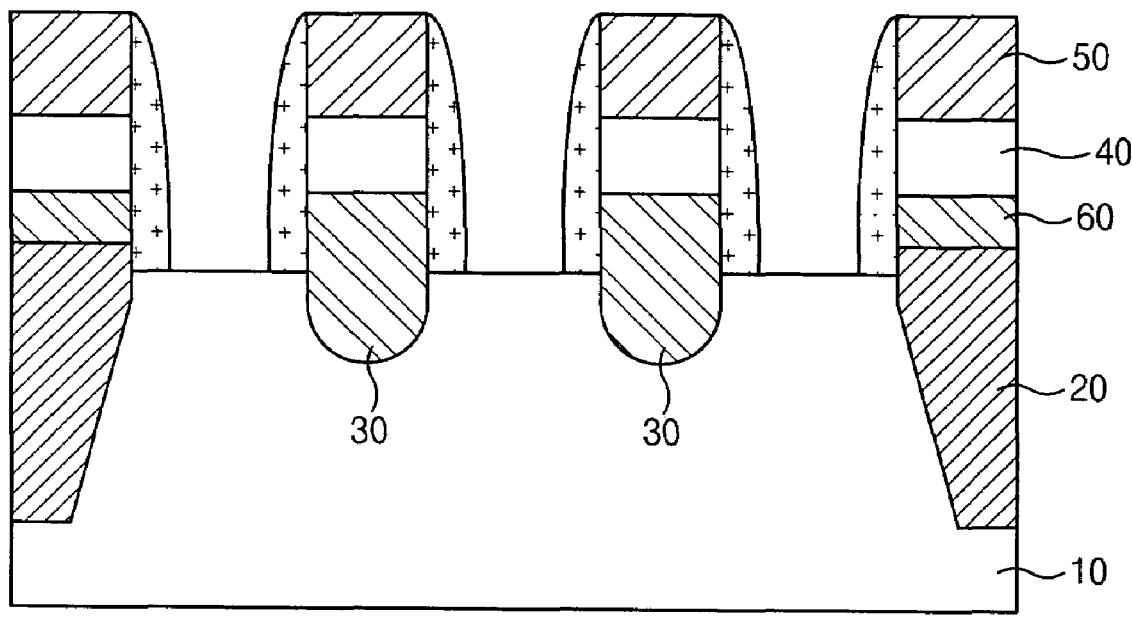
FIG. 1 is a cross-sectional view illustrating a conventional method for forming a recess gate of a semiconductor device.
Figure 2A:
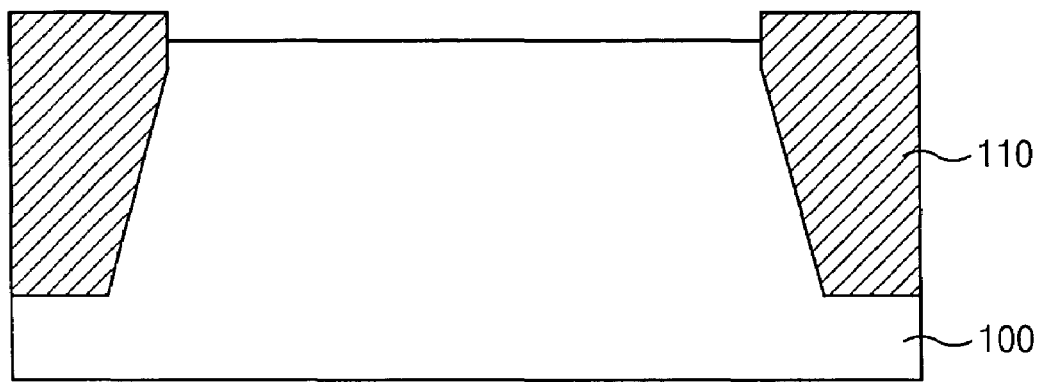
FIGS. 2a through 2j are cross-sectional views illustrating a method for forming a recess gate of a semiconductor device in accordance with a preferred embodiment of the present invention.

Referring to FIG. 2a, a device isolation film 110 defining an active region is formed on a semiconductor substrate 100.

Figure 2B:
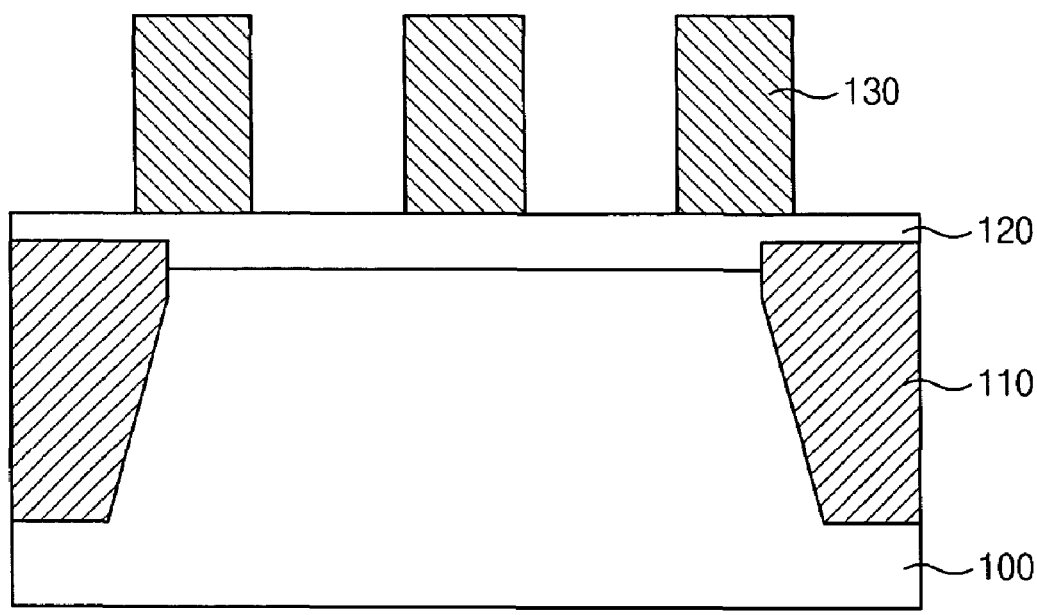

Referring to FIG. 2b, a polysilicon layer 120 is formed on the entire surface including a surface of the semiconductor substrate 100. A first photoresist film pattern 130 covering a contact region and exposing a recess gate region is then formed on the polysilicon layer 120.

Figure 2C:
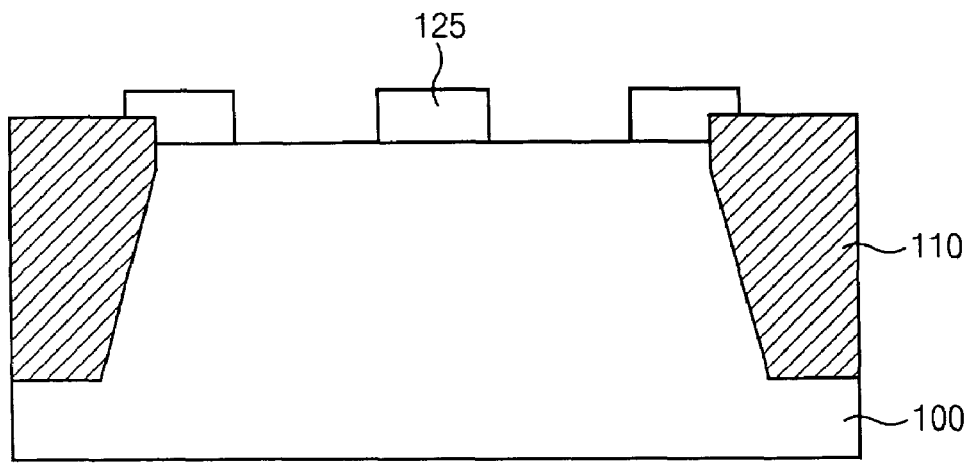

Referring to FIG. 2c, the polysilicon layer 120 is etched using the first photoresist film pattern 130 as an etching mask to form a polysilicon layer pattern 125 covering the contact region. Thereafter, the first photoresist film pattern 130 is removed.

Figure 2D:
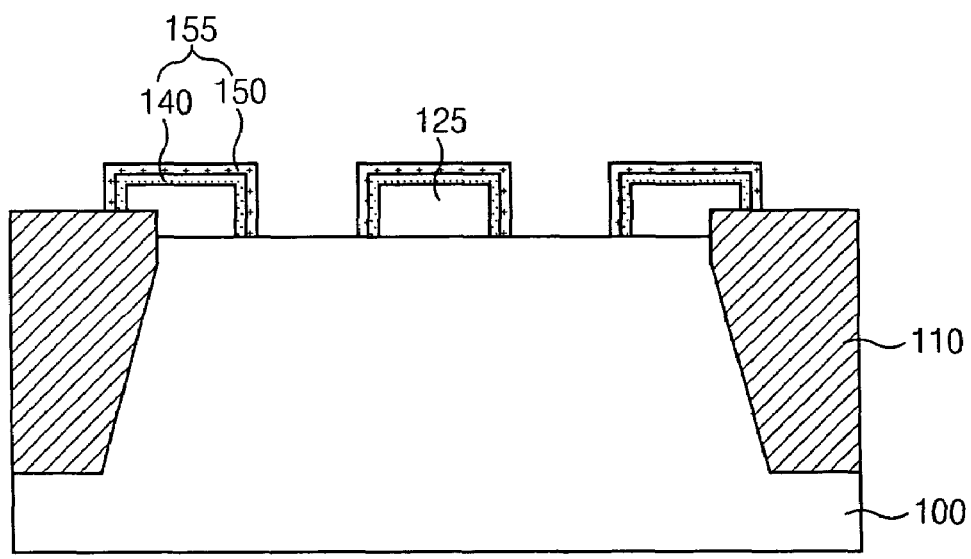

Referring to FIG. 2d, an insulating film 155 covering the polysilicon layer pattern 125 is formed. Preferably, the insulating film 155 comprises a stacked structure of an oxide film 140 and a nitride film 150. The insulating film 155 prevents attack on the polysilicon layer pattern 125 during the formation process of a recess gate region 160 in the active region.

Figure 2E:
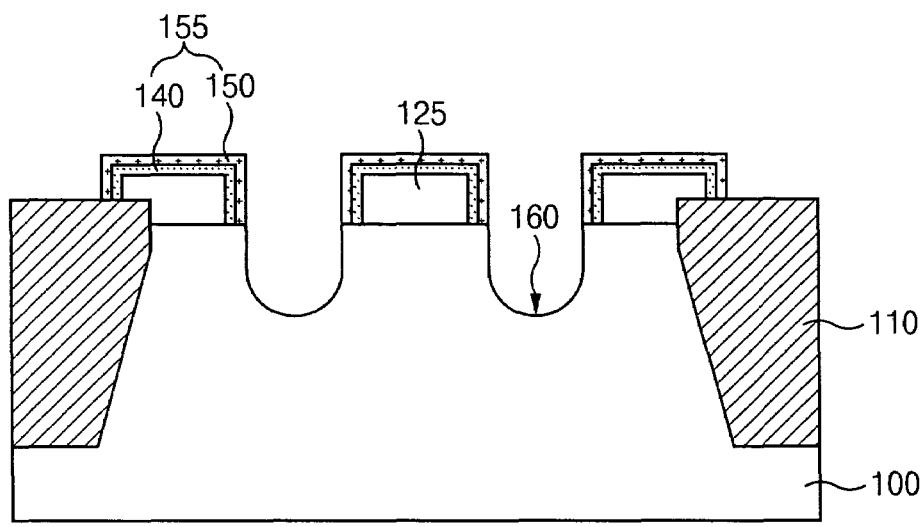

Referring to FIG. 2e, a predetermined thickness of the semiconductor substrate 100 is etched using the polysilicon layer pattern 125 including the insulating film 155 as an etching mask to form the recess gate region 160 in the active region. Preferably, the predetermined thickness of the semiconductor substrate 100 etched ranges from 80 nm to 150 nm.

Figure 2F:
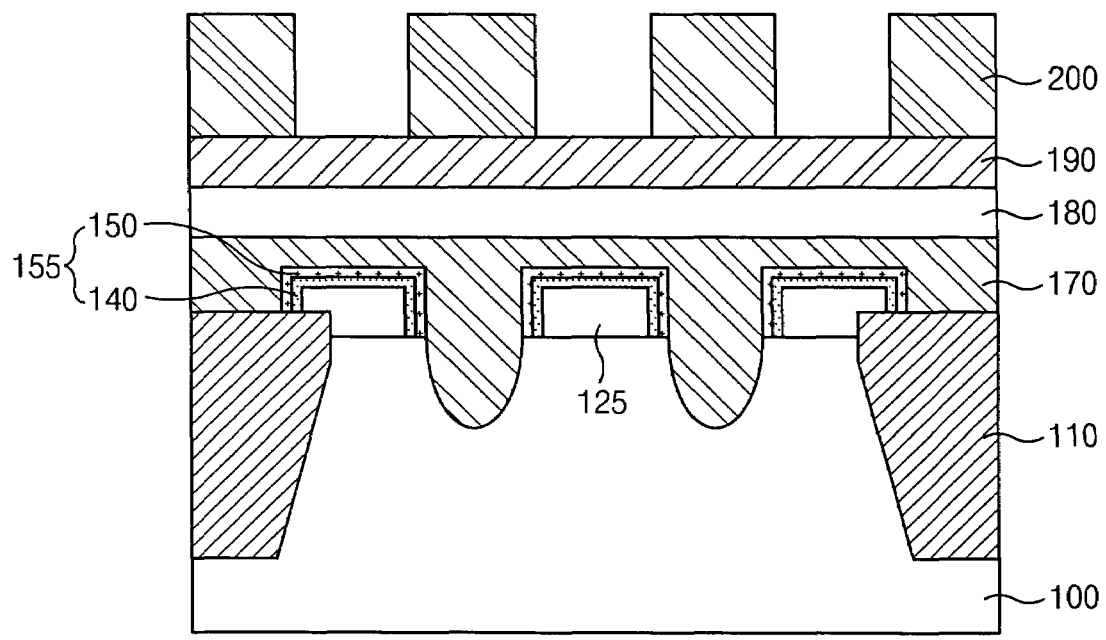

Referring to FIG. 2f, a planarized gate polysilicon layer 170 at least filling up the recess gate region 160 is formed on the entire surface.

Next, a gate conductive layer 180 and a gate hard mask layer 190 are formed on the planarized gate polysilicon layer 170 to form a stacked structure of the gate polysilicon layer 170, a gate conductive layer 180 and a gate hard mask layer 190. A thickness of the gate polysilicon layer 170 may be greater than that of the stacked structure of the polysilicon layer pattern 125 and the insulating film 155. The gate conductive layer 180 may comprise a tungsten layer or a tungsten silicide layer to reduce resistance of a gate.

Moreover, the gate hard mask layer 190 may comprise a nitride film to prevent a SAC (Self Align Contact) fail in a subsequent process for forming a landing plug contact hole.

Thereafter, a second photoresist film pattern 200 defining a gate region is formed on the gate hard mask layer 190.

Figure 2G:
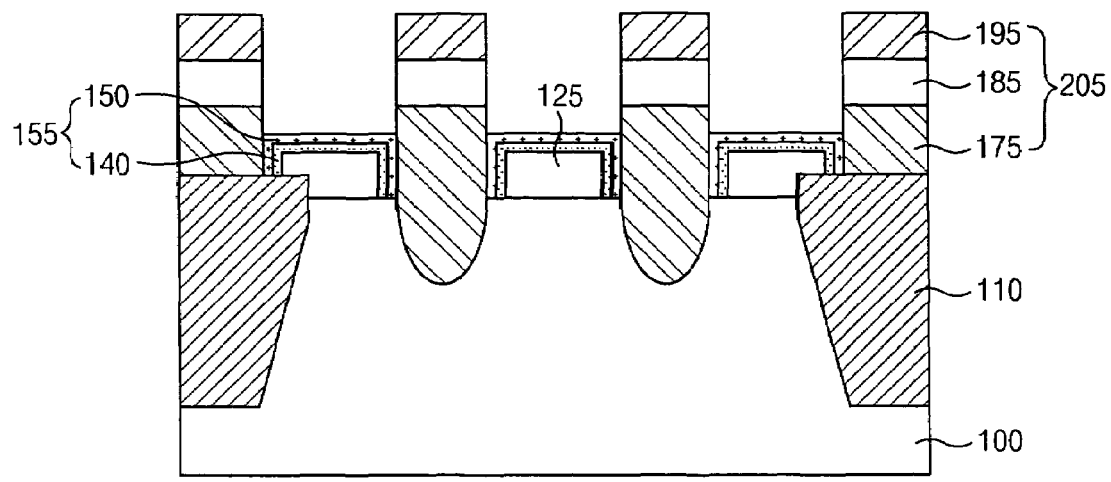

Referring to FIG. 2g, the stacked structure is etched using the second photoresist film pattern 200 as an etching mask to form a gate structure 205 including a gate polysilicon layer pattern 175, a gate conductive layer pattern 185 and a gate hard mask layer pattern 195 and expose the insulating film 155.

Figure 2H:
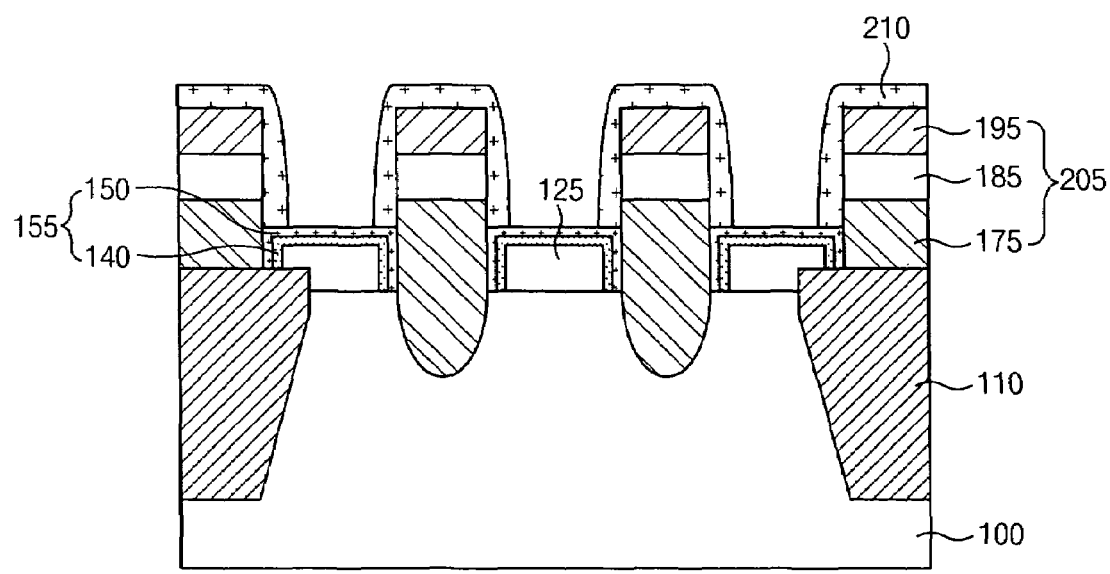

Referring to FIG. 2h, a spacer 210 covering the gate structure 205 is formed. The spacer 210 preferably comprises a nitride film.

Figure 2I:
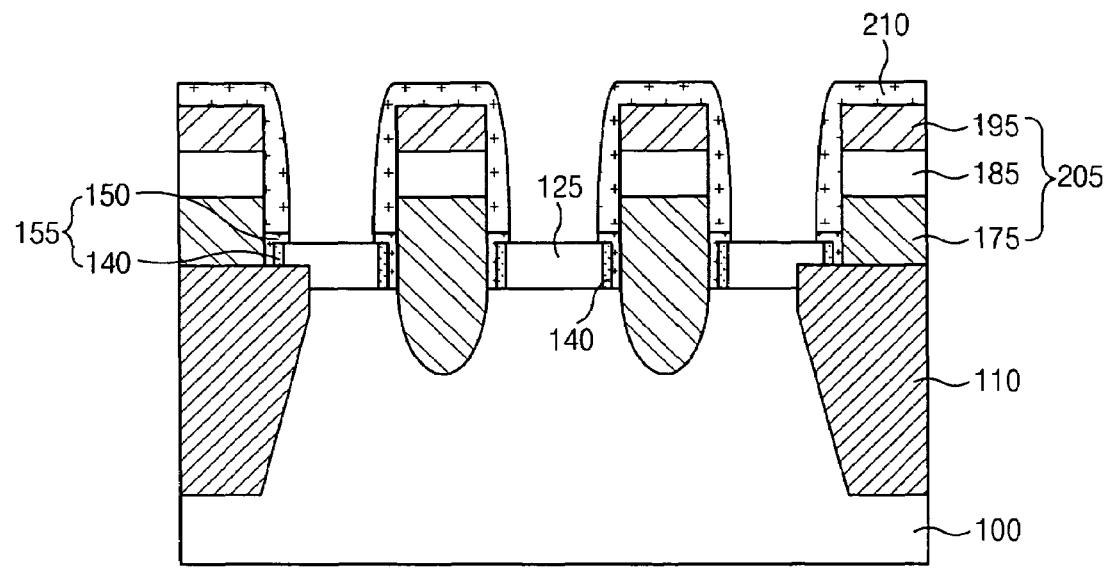

Referring to FIG. 2i, the exposed insulating film 155 on the contact region is removed.

Figure 2J:
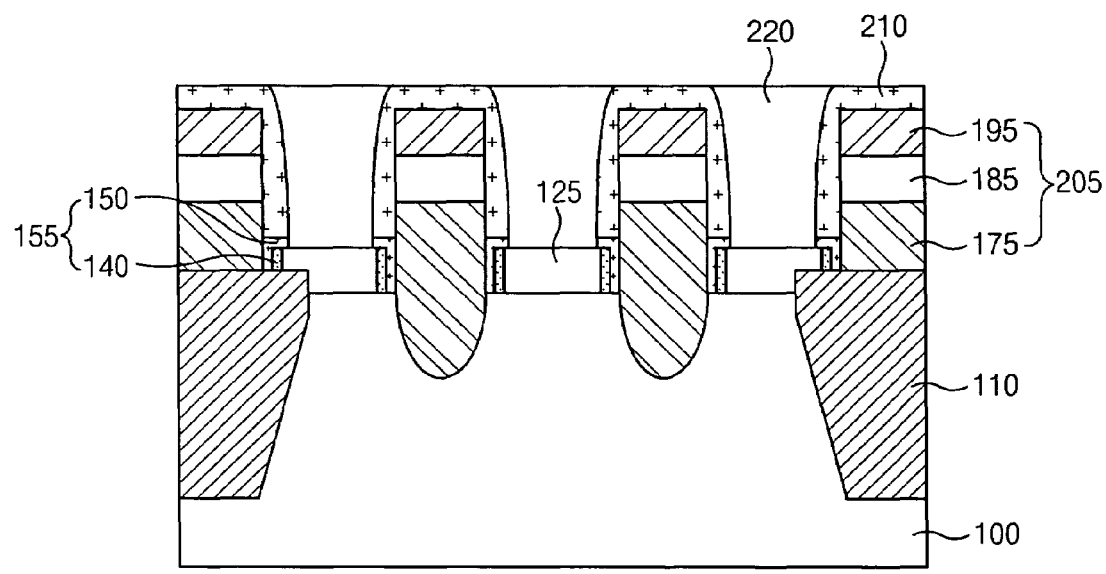

Referring to FIG. 2j, the space between the gate structures 205 including the spacer 210 is filled up with a polysilicon film to form a landing plug 220.

As described above, the method for forming a recess gate of a semiconductor device in accordance with the present invention provides an improved resistance characteristic of the contact region and tWR characteristic of the device by forming a polysilicon layer pattern covering a contact region and to secure the contact region prior to formation of a gate structure.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a recess gate of a semiconductor device, comprising the steps of:
   (a) forming a polysilicon layer pattern on a semiconductor substrate having an active region, the polysilicon layer pattern covering a contact region;
   (b) forming an insulating film covering the polysilicon layer pattern;
   (c) etching a predetermined thickness of the semiconductor substrate using the polysilicon layer pattern as an etching mask to form a recess gate region in the active region;
   (d) forming a planarized gate polysilicon layer at least filling up the recess gate region;
   (e) depositing a gate conductive layer and a gate hard mask layer on the gate polysilicon layer to form a stacked structure of the gate polysilicon layer, the gate conductive layer and the gate hard mask layer;
   (f) etching the stacked structure to form a gate structure, whereby the insulating film is exposed;
   (g) forming a spacer on a top surface and a sidewall of the gate structure;
   (h) removing the exposed insulating film to expose the polysilicon layer pattern; and
   (i) depositing a polysilicon film on the exposed polysilicon layer pattern in the contact region to form a landing plug.

2. The method according to claim 1, wherein the insulating film comprises a stacked structure of an oxide film and a nitride film.

3. The method according to claim 1, wherein the predetermined thickness of the semiconductor substrate in the step (c) ranges from 80 nm to 150 nm.

\* \* \* \* \*